(12) United States Patent  
Baudelot et al.

(10) Patent No.: US 6,535,050 B2  
(45) Date of Patent: Mar. 18, 2003

(54) HYBRID POWER MOSFET FOR HIGH CURRENT-CARRYING CAPACITY

(75) Inventors: Eric Baudelot, Weisendorf; Manfred Bruckmann, Nuremberg; Heinz Mitlehner, Uttenreuth; Benno Weis, Hemhofen, all of (DE)

(73) Assignee: Siemens Aktiengesellschaft, Munich (DE)

( * ) Notice: Subject to any disclaimer, the term of this patent is extended or adjusted under 35 U.S.C. 154(b) by 263 days.

(21) Appl. No.: 09/911,167

(22) Filed: Jul. 23, 2001

(65) Prior Publication Data

US 2001/0050589 A1 Dec. 13, 2001

Related U.S. Application Data

(63) Continuation of application No. PCT/DE00/00119, filed on Jan. 13, 2000.

(30) Foreign Application Priority Data

Jan. 22, 1999 (DE) .......................................... 199 02 519

(51) Int. Cl.[7] .............................................. H03K 17/687
(52) U.S. Cl. ...................................... 327/430; 327/431
(58) Field of Search ................................. 327/430, 431, 327/427, 434–437, 574, 581

(56) References Cited

U.S. PATENT DOCUMENTS 4,492,883 A  *  1/1985  Janutka ...................... 327/430

FOREIGN PATENT DOCUMENTS

DE  19610135  6/1997
EP  0130082  1/1985

OTHER PUBLICATIONS

Muraguchi et al., "A Novel MMIC Power Amplifier for Pocket–Size Cellular Telephones", 1993 IEEE MTT–S Digest, pp. 793–796.

McGrath et al., "A 1.9–GHz GaAs Chip Set for the Personal Handyphone System", 1995 IEEE Transactions on Microwave Theory and Techniques, Jul., No. 7, PT. II, 1995, 1733–1743.

* cited by examiner

Primary Examiner—Toan Tran
(74) Attorney, Agent, or Firm—BakerBotts LLP

(57) ABSTRACT

A hybrid power MOSFET having a low blocking-capability MOSFET and a high blocking-capability junction FET is disclosed. In accordance with the present invention, this cascode circuit has at least two high blocking-capability junction FETs which are electrically connected in parallel and whose gate connections are respectively electrically conductively connected to the source connection of the low blocking-capability MOSFET by means of a connecting line. Thus, a hybrid power MOSFET for a high current-carrying capacity is obtained whose design technology has been considerably simplified on account of the use of only one control line and n+1 chips.

7 Claims, 2 Drawing Sheets

HYBRID POWER MOSFET FOR HIGH CURRENT-CARRYING CAPACITY

"This is a continuation of copending application Ser. No. PCT/DE00/00119 filed Jan. 13, 2000, PCT Publication WO 00/44088, which claims the priority of DE 199 02 519.3 filed Jan. 22, 1999."

FIELD OF THE INVENTION

The present invention relates to a hybrid power MOSFET having a low blocking-capability MOSFET and a high blocking-capability junction FET.

BACKGROUND OF THE INVENTION

A hybrid power MOSFET having a low blocking-capability MOSFET and a high blocking-capability junction FET is known from DE 196 10 135 C1. FIG. 1 is used herein to describe this known hybrid power MOSFET in more detail.

Referring to FIG. 1, this hybrid power MOSFET has a normally-off n-channel MOSFET 2, in particular a low voltage power MOSFET, and a normally-on n-channel junction FET 4. This high blocking-capability junction FET 4 is also referred to as a Junction Field Effect Transistor (JFET). These two FETs are electrically connected in series such that the source connection S of the junction FET 4 is electrically conductively connected to the drain connection D' of the MOSFET 2, and that the gate connection G of the junction FET 4 is electrically conductively connected to the source connection S' of the MOSFET 2. This electrical interconnection of these two semiconductor components is also commonly known as a cascode circuit. The low blocking-capability MOSFET 2 in this cascode circuit has an internal bipolar diode $D_{IN}$ which is connected in antiparallel with MOSFET 2 and is referred to generally as an inverse diode or internal freewheeling diode. The normally-off n-channel MOSFET 2 is made of silicon, whereas the normally-off n-channel JFET 4 is made of silicon carbide. This hybrid power MOSFET is designed for a high reverse voltage of over 600 volts and has only low losses in the passband.

This known cascode circuit is controlled using the gate voltage $U_{G'S'}$ of the normally-off MOSFET 2. If MOSFET 2 is on or the antiparallel internal diode $D_{IN}$ of MOSFET 2 is conducting a current, the drain voltage $U_{D'S'}$ of MOSFET 2 is approximately zero. The coupling between the gate connection of JFET 4 and the source connection S' of MOSFET 2 means that the gate voltage $U_{GS'}$ of JFET 4 is zero to slightly negative or positive. In accordance with a transfer characteristic, approximately the largest drain current $I_D$ flows through JFET 4. If MOSFET 2 is turned off, the drain voltage $U_{D'S'}$ rises until the maximum permissible reverse voltage of MOSFET 2 has been reached. The value of the reverse voltage in a low voltage power MOSFET 2 is 30 volts, for example. As soon as the value of the drain voltage $U_{D'S'}$ of MOSFET 2 exceeds the value of the threshold voltage $U_{Th}$ of JFET 4, the drain current $I_D$ of JFET 4 is zero in accordance with its transfer characteristic. In other words JFET 4 is off. The coupling between the gate connection G of JFET 4 and the source connection S' of MOSFET 2 means that the drain voltage $U_{D'S'}$ of MOSFET 2 is fed back negatively to the gate G of JFET 4.

The known hybrid power MOSFET can, in principle, be connected in parallel, thereby increasing the current-carrying capacity of the whole arrangement. The drawbacks of such a conventional parallel connection of n cascode circuits are as follows: (a) with n parallel cascode circuits, 2n chips are required, which complicates the design technology; and (b) with n parallel cascode circuits, n control lines are required on account of the decoupling of the gate connections of the n MOSFETs.

SUMMARY OF THE INVENTION

The present invention provides for increasing the current-carrying capacity of the known hybrid power MOSFET by using only one low blocking-capability MOSFET and at least two high blocking-capability junction FETs electrically connected in parallel, thus reducing the number of chips in a hybrid power MOSFET having n high blocking-capability junction FETs to n+1 chips. In addition, only one control line is required, since only one low blocking-capability MOSFET is used. This MOSFET has the function of a control head. In addition, the design technology for this inventive hybrid power MOSFET for a high current-carrying capacity is greatly simplified, since instead of 2n chips in a conventional parallel circuit only n+1 chips are now used in the cascode circuit.

In one advantageous refinement of the inventive hybrid power MOSFET of the present invention, a gate resistor is arranged in each connecting line between a gate connection of the parallel-connected junction FETs and a source connection of the low blocking-capability MOSFET. This decouples the control loops of the junction FETs from one another and thus significantly improves the switching response of the hybrid power MOSFET.

In another advantageous refinement of the inventive hybrid power MOSFET of the present invention, an inductance is arranged in each connecting line between the drain connection of the low blocking-capability MOSFET and a source connection of the parallel-connected junction FETs. This improves the balancing of the dynamic current division of the hybrid power MOSFET.

In another advantageous refinement of the present invention, each junction FET of the inventive hybrid power MOSFET has a gate resistor, and a respective inductance is arranged in the connecting lines of the MOSFET with the parallel-connected junction FETs. Thus, a hybrid power MOSFET is obtained whose switching procedure and whose balancing of the dynamic current distribution has been improved. This embodiment is particularly advantageous when the inductance used is a respective elongated bonding wire.

BRIEF DESCRIPTION OF THE DRAWINGS

For a complete understanding of the present invention and the advantages thereof, reference is now made to the following description taken in conjunction with the accompanying drawings in which like reference numbers indicate like features, components and method step, and wherein.

DETAILED DESCRIPTION OF THE INVENTION

Figure 1:
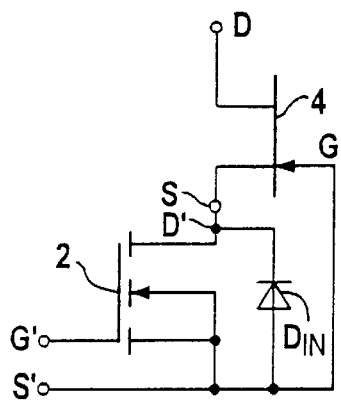
FIG. 1 illustrates the circuit for a known hybrid power MOSFET.
Figure 2:
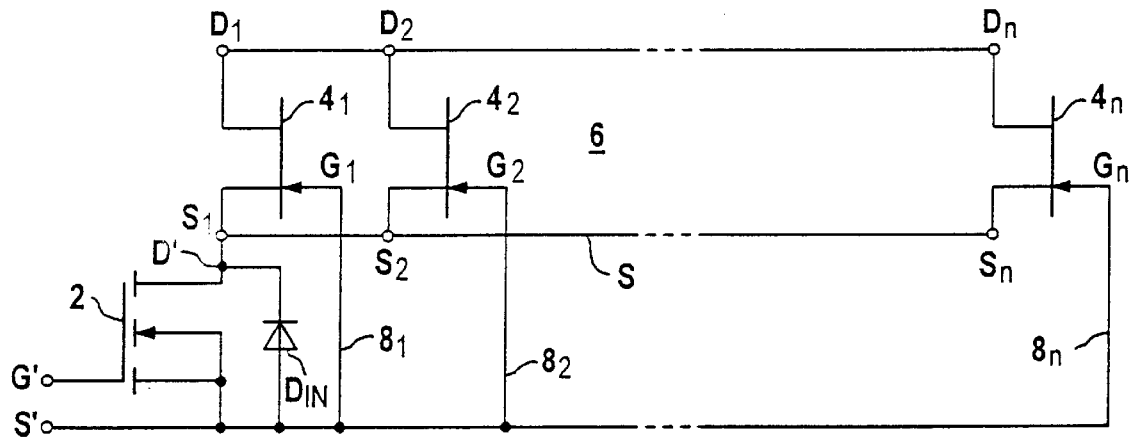
FIG. 2 illustrates a circuit for an inventive hybrid power MOSFET of the present invention.

Now referring to the drawings, FIG. 2 illustrates an inventive hybrid power MOSFET of the present invention in detail. This hybrid power MOSFET has a low blocking-capability MOSFET 2 and n high blocking-capability junction FETs $4_1$ to $4_n$. The number of junction FETs $4_1$ to $4_n$ used depends on the required current-carrying capacity of the hybrid power MOSFET.

These n JFETs $4_1$ to $4_n$ are electrically connected in parallel. The common source connection S of this parallel circuit 6 is electrically conductively connected to the drain connection D' of the low blocking-capability MOSFET 2. This MOSFET 2 has the function of a control head. The use of only one MOSFET 2 obviates n−1 control lines as compared with a conventional parallel circuit comprising a plurality of known hybrid power MOSFETs, which significantly improves the design of this inventive cascode circuit. The gate connections $G_1$ to $G_n$ of the parallel-connected JFETs $4_1$ to $4_n$ are connected to the source connection S' of the low blocking-capability MOSFET 2 by means of a connecting line $8_1$ to $8_n$. As in the case of the known hybrid power MOSFET, the low blocking-capability MOSFET 2 used in the inventive hybrid power MOSFET is a normally-off n-channel power MOSFET, in particular a low voltage power MOSFET, made of silicon. The JFETs $4_1$ to $4_n$ used are each made of silicon carbide.

Figure 3:
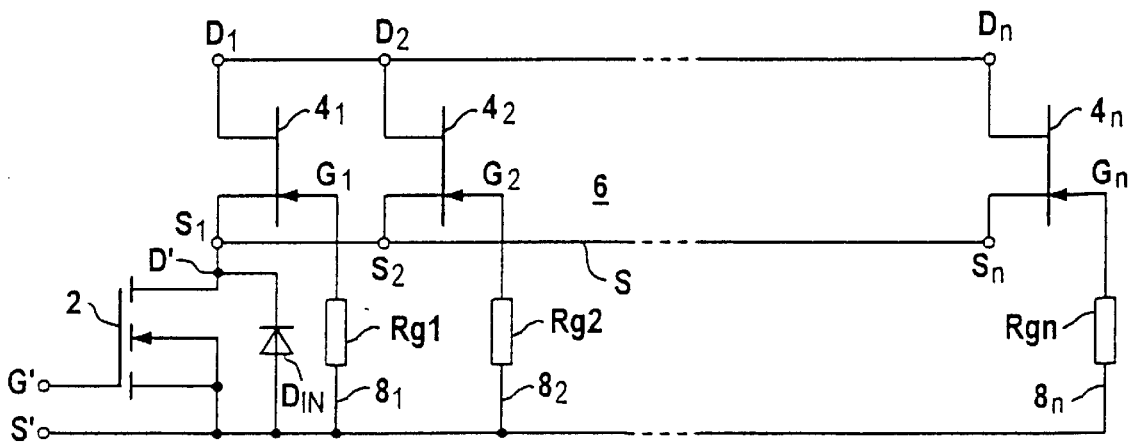
FIG. 3 illustrates an exemplary embodiment of the inventive hybrid power MOSFET of FIG. 2.

In one advantageous embodiment of the inventive hybrid power MOSFET, shown in FIG. 3, the gate resistors Rg1 to Rgn are arranged in each connecting line $8_1$ to $8_n$ of the parallel circuit 6. The use of these gate resistors Rg1 to Rgn decouples the control loops of JFETs $4_1$ to $4_n$ from one another. This significantly improves the switching response of this inventive cascode circuit.

Figure 4:
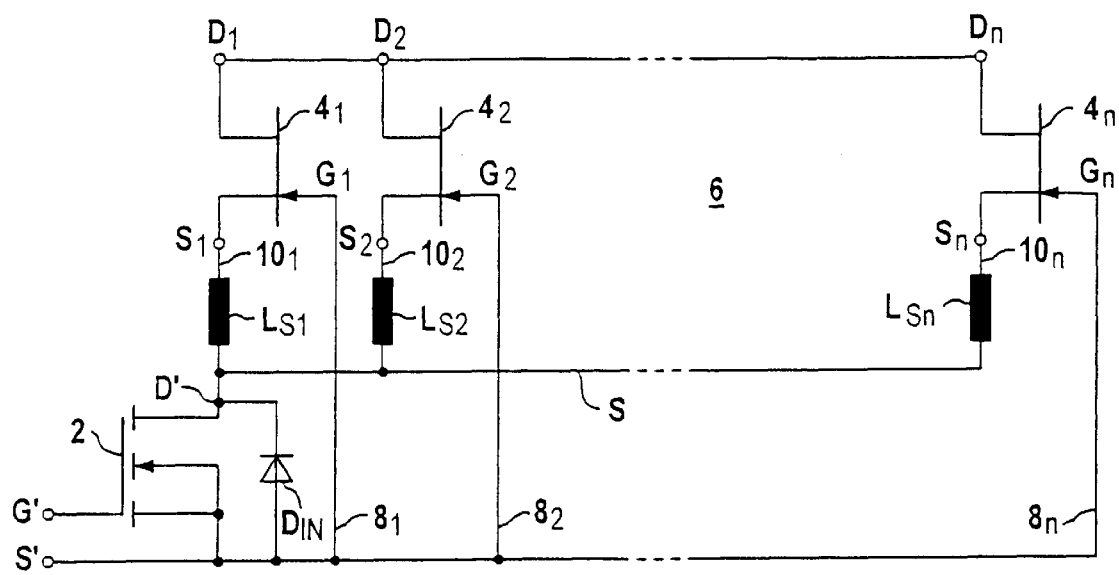
FIG. 4 illustrates another exemplary embodiment of the inventive hybrid power MOSFET of FIG. 2.

FIG. 4 shows a further advantageous embodiment of the inventive hybrid power MOSFET of FIG. 2 in more detail. In this embodiment, a respective inductance $L_{S1}$ to $L_{Sn}$ is arranged in the connecting lines $10_1$ to $10_n$ between the source connections $S_1$ to $S_n$ and the drain connection $D_{40}$ of the low blocking-capability MOSFET 2. These inductances $L_{S1}$ to $L_{Sn}$ feed back the voltage drops across these inductances $L_{S1}$ to $L_{Sn}$, on account of current changes, to the corresponding gate voltages of each individual JFET $4_1$ to $4_n$, so that the current changes in the individual JFETs $4_1$ to $4_n$ are balanced. This permits an ideally equal current loading for all the JFETs $4_1$ to $4_n$. Since small values for the inductance $L_{S1}$ to $L_{Sn}$ result in marked voltage drops across the inductances $L_{S1}$ to $L_{Sn}$ with corresponding current gradients, the value of these inductances $L_{S1}$ to $L_{Sn}$ can be very small. This means that the inductances $L_{S1}$ to $L_{Sn}$ provided can be a respective elongated bonding wire between the source connections $S_1$ to $S_n$ of the parallel-connected JFETs $4_1$ to $4_n$ and the drain connection D' of the hybrid power MOSFET 2.

Figure 5:
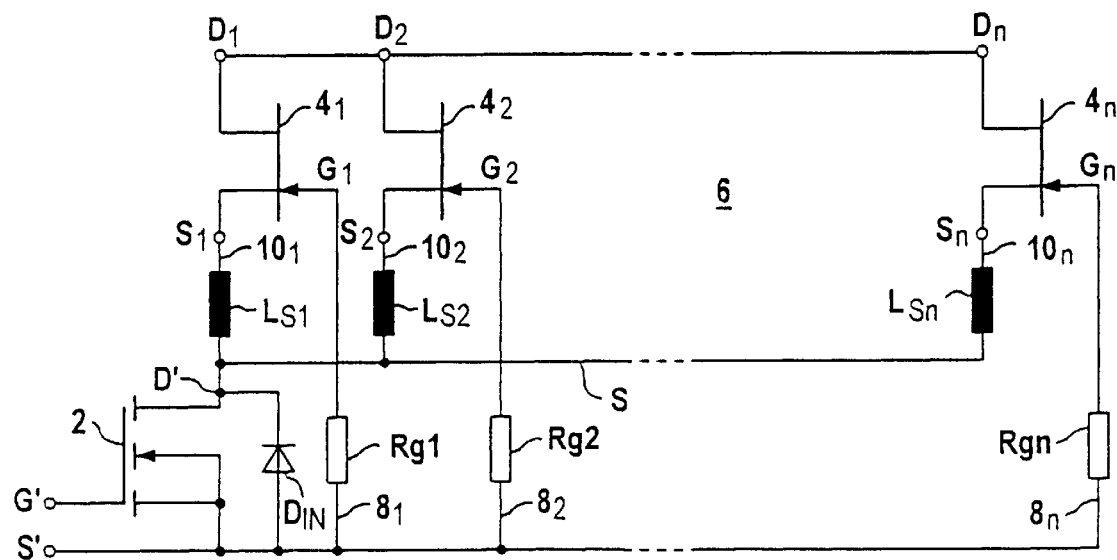
FIG. 5 illustrates another exemplary embodiment of the inventive hybrid power MOSFET of FIG. 2.

FIG. 5 illustrates another advantageous embodiment of the hybrid power MOSFET shown in FIG. 2. This embodiment combines the embodiment shown in FIG. 3 with the embodiment shown in FIG. 4. Thus, a cascode circuit is obtained whose balancing of the dynamic current splitting and whose switching response are improved.

Although the present invention has been described in detail with reference to specific exemplary embodiments thereof, various modifications, alterations and adaptations may be made by those skilled in the art without departing from the spirit and scope of the invention. It is intended that the invention be limited only by the appended claims.

We claim:

1. A hybrid power MOSFET, said hybrid power MOSFET comprising:

a low blocking-capability MOSFET; and at least two high blocking-capability junction FETs, wherein said junction FETs are electrically connected in parallel, wherein a drain connection of said low blocking-capability MOSFET is connected to a source connection of a parallel circuit comprising said junction FETs, and wherein gate connections of said parallel-connected junction FETs are respectively electrically conductively linked to a source connection of said low blocking-capability MOSFET.

2. The hybrid power MOSFET as claimed in claim 1, wherein a gate resistor is arranged in each connecting line between a gate connection of said parallel-connected junction FETs and said source connection of said low blocking-capability MOSFET.

3. The hybrid power MOSFET as claimed in claim 1 or 2, wherein an inductance is arranged in each said connecting line between said drain connection of said low blocking-capability MOSFET and said source connection of said parallel-connected junction FETs.

4. The hybrid power MOSFET as claimed in claim 3, wherein said inductance comprises a respective elongated bonding wire.

5. The hybrid power MOSFET as claimed in claim 1, wherein said low blocking-capability MOSFET comprises a low voltage power MOSFET.

6. The hybrid power MOSFET as claimed in claim 1, wherein said low blocking-capability MOSFET comprises silicon.

7. The hybrid power MOSFET as claimed in claim 1, wherein each of said junction FETs comprises silicon carbide.

* * * * *